(12) United States Patent
Choi et al.

(10) Patent No.: US 7,875,889 B2
(45) Date of Patent: *Jan. 25, 2011

(54) ACTIVE MATRIX TYPE ORGANIC ELECTROLUMINESCENT DISPLAY DEVICE AND METHOD OF MANUFACTURING THE SAME

(75) Inventors: Beom-Rak Choi, Seoul (KR); Joon-Hoo Choi, Seoul (KR); Chong-Chul Chai, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 202 days.

This patent is subject to a terminal disclaimer.

(21) Appl. No.: 12/208,657

(22) Filed: Sep. 11, 2008

(65) Prior Publication Data

US 2009/0009094 A1 Jan. 8, 2009

Related U.S. Application Data

(63) Continuation of application No. 10/505,644, filed on Aug. 13, 2004, now Pat. No. 7,435,992.

(51) Int. Cl.
*H01L 29/04* (2006.01)
*H01L 29/15* (2006.01)
*H01L 31/036* (2006.01)

(52) U.S. Cl. .................. 257/72; 257/E51.022; 345/76; 349/38; 438/22

(58) Field of Classification Search .............. 257/72, 257/E51.022; 345/76; 349/38; 438/22
See application file for complete search history.

(56) References Cited

U.S. PATENT DOCUMENTS

| 6,229,506 B1 * | 5/2001 | Dawson et al. ............... 345/82 |
| 6,437,839 B1 * | 8/2002 | Cacharelis .................... 349/39 |
| 7,435,992 B2 * | 10/2008 | Choi et al. ..................... 257/72 |

* cited by examiner

Primary Examiner—Asok K Sarkar
(74) Attorney, Agent, or Firm—F. Chau & Associates LLC (57) ABSTRACT

Disclosed are an active matrix type organic electroluminescent display device and a manufacturing method thereof. At least two capacitors having different functions from each other are disposed in a vertically stacked structure within a unit pixel region. When a compensation circuit needing two or more capacitors having different functions from each other per pixel is applied, the two or more capacitors are vertically stacked, thereby preventing the aperture ratio from being lowered due to the increase in the number of capacitors within the pixel.

12 Claims, 9 Drawing Sheets

ACTIVE MATRIX TYPE ORGANIC ELECTROLUMINESCENT DISPLAY DEVICE AND METHOD OF MANUFACTURING THE SAME

CROSS-REFERENCE TO RELATED APPLICATIONS

This application is a continuation of U.S. application Ser. No. 10/505,644 filed on Aug. 13, 2004 now U.S. Pat. No. 7,435,992, which claims priority to Korean Appln. No. 2002-9590 filed Feb. 22, 2002, the contents of which are incorporated herein by reference in their entireties.

BACKGROUND OF THE INVENTION

The present invention relates to an active matrix type organic electroluminescent display (AMOLED) device and method of manufacturing the same, and more particularly, to an AMOLED device and a method of manufacturing the same capable of preventing the aperture ratio from being lowered when compensation circuits needing two or more capacitors per pixel are applied.

BACKGROUND ART

In the information society of these days, electronic display devices are more important as information transmission media and various electronic display devices are widely applied for industrial apparatus or home appliances. Such electronic display devices are being continuously improved to have new appropriate functions for various demands of the information society.

In general, electronic display devices display and transmit various pieces of information to users who utilize such information. That is, the electronic display devices convert electric information signals outputted from electronic apparatus into light information signals recognized by users through their eyes.

In the electronic display devices dividing into an emissive display device and a non-emissive display device, the emissive display device displays light information signals through a light emission phenomena thereof and the non-emissive display device displays the light information signals through a reflection, a scattering or an interference thereof. The emissive display device includes a cathode ray tube (CRT), a plasma display panel (PDP), a light emitting diode (LED) and an electroluminescent display (ELD). The emissive display device is called as an active display device. Also, the non-emissive display device, called as a passive display device, includes a liquid crystal display (LCD), an electrochemical display (ECD) and an electrophoretic image display (EPID).

The CRT has been used for a television receiver or a monitor of a computer as the display device for a long time since it has a high quality and a low manufacturing cost. The CRT, however, has some disadvantages such as a heavy weight, a large volume and high power consumption.

Recently, the demand for a new electronic display device is greatly increased such as a flat panel display device having excellent characteristics, for example, thin thickness, light weight, low driving voltage and low power consumption. Such flat panel display devices can be manufactured according to the rapidly improved semiconductor technology.

An electroluminescent (EL) element is attracting attention of interested person as one of the flat panel displays. The EL element is generally divided into an inorganic EL element and an organic EL element depending on used materials.

The inorganic EL element is a device in which a high electric field is applied to a light emitting part and electrons are accelerated in the applied high electric field to collide with a light emitting center, so that the light emitting center may be exited to emit a light beam.

The organic EL element is a device in which electrons and holes are injected into a light emitting part from cathode and anode, respectively, and the injected electrons and holes are combined with each other to generate excitons, thereby emitting light when these excitons are transited from an excited state to a base state.

Owing to the above operation mechanism, the inorganic EL element needs a high driving voltage of 100-200 V, whereas the organic EL element operates at a low voltage of 5-20 V. The above advantage of the organic EL element is activating researches on the organic ELD. Also, the organic EL element has superior properties such as wide viewing angle, high response speed, high contrast and the like.

The organic EL elements can be applied to both of the active matrix type display device and the passive matrix type display device. The active matrix organic EL display device is a display device that independently drives EL elements corresponding to a plurality of pixels using switching elements such as a thin film transistor. The organic EL display device is also referred to as an organic electroluminescent display (OELD) device or an organic light emitting device (OLED). Hereinafter, the active matrix organic EL display device is referred to as AMOLED device.

Figure 1:
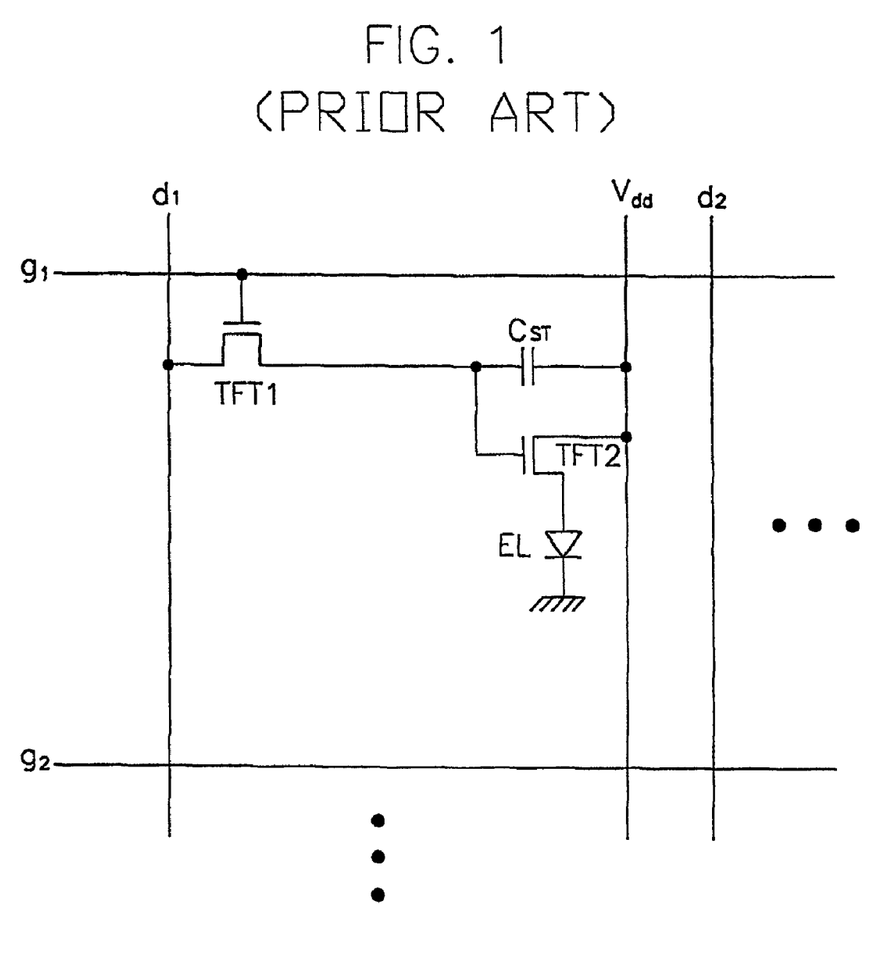
FIG. 1 is a circuit diagram of a conventional AMOLED device.

FIG. 1 is an equivalent circuit diagram of a conventional AMOLED device.

Referring to FIG. 1, a unit pixel circuit of a conventional AMOLED device includes two thin film transistors TFT1 and TFT2, and one capacitor Cst.

Specifically, a plurality of gate lines g1 and g2 and a plurality of data lines d1 and d2 are arranged to cross each other, thereby defining a unit pixel region. Between the adjacent data lines d1 and d2, there is arranged a direct current signal line Vdd to be parallel to the data lines d1 and d2. A maximum value of a display signal is applied to the Vdd line in the form of direct current.

A first thin film transistor TFT 1 as a switching element is connected at a cross point of the gate line g1 and the data line d1. A gate electrode of the TFT1 is connected to the gate line g1 and a source electrode of the TFT 1 is connected to the data line d1.

Between a drain electrode of the TFT1 and the Vdd line, there is connected a storage capacitor Cst. Also, between the drain electrode of the TFT1 and the Vdd line, there is connected a second thin film transistor TFT2 as a driving element which is in parallel with the storage capacitor Cst. A gate electrode of the TFT2 is connected to the drain electrode of the TFT1, a source electrode thereof is connected to the Vdd line and a drain electrode thereof is connected to an organic EL element.

If the TFT1 is turned on, the TFT2 is turned on depending on a display signal value of the data line d1, so that a direct current signal value of the Vdd line is applied to the organic EL element, thereby driving the organic EL element.

However, in the above AMOLED device to which the circuit using the two TFTs is applied, there occurs a problem in that brightness of the panel becomes non-uniform due to a deflection in the characteristics of the driving TFT, for example, variation in the threshold voltage.

In order to compensate for the deflection in the characteristics of the driving TFT, there were proposed compensation circuits to which a separate thin film transistor is added.

However, in case that these compensation circuits are applied, the number of the thin film transistors increases and thus, an area occupied by the thin film transistors in a unit pixel region increases to thereby decrease the aperture ratio. Further, since a part of the compensation circuits needs two capacitors having different functions from each other, the number of the thin film transistors and the capacitors arranged in a unit pixel increases to cause the reduction of the aperture ratio. The reduction in the aperture ratio lowers the brightness, and requires a high current driving so that the life of the circuit is shortened.

DISCLOSURE OF THE INVENTION

Accordingly, it is an object of the present invention to provide an active matrix type organic electroluminescent display (AMOLED) device capable of preventing the aperture ratio from being lowered when compensation circuits needing two or more capacitors per pixel are applied.

It is another object of the invention to provide a method for manufacturing an AMOLED device capable of preventing the aperture ratio from being lowered when compensation circuits needing two or more capacitors per pixel are applied.

In one aspect, there is provided an AMOLED in which at least two capacitors having different functions from each other are disposed in a vertically stacked structure within a unit pixel region.

According to another aspect of the invention, there is provided an AMOLED in which a unit pixel is defined by first and second gate lines extending in a first direction, and a data line and a direct current signal line extending in a second direction perpendicular to the first direction. A first thin film transistor has a first gate electrode connected to the first gate line and a first source electrode connected to the data line. A second thin film transistor has a second gate electrode connected to the second gate line. A third thin film transistor has a third source electrode connected to the direct current signal line. An organic EL element is connected between a third drain electrode of the third thin film transistor and a ground terminal. A first capacitor includes a first electrode and a second electrode, the first electrode being connected to a third gate electrode of the third thin film transistor and a second source electrode of the second thin film transistor, and the second electrode being connected to a drain electrode of the first thin film transistor. A second capacitor includes a third electrode connected to the second electrode and the direct current signal line. The first and second capacitors are formed in a vertically stacked structure, and have different functions from each other.

In a further another aspect of an AMOLED according to the present invention, a unit pixel is defined by first and second gate lines extending in a first direction, and a data line and a direct current signal line extending in a second direction perpendicular to the first direction. A first thin film transistor includes a first active pattern disposed adjacent to a cross point of the first gate line and the data line, a first gate electrode prolonged from the first gate line and crossing over the first active pattern, a first source electrode prolonged from the data line and connected to the first active pattern at one side of the first gate electrode, and a first drain electrode connected to the first active pattern at the other side of the first gate electrode. A second thin film transistor includes a second active pattern disposed adjacent to a cross point of the second gate line and the data line, a second gate electrode prolonged from the second gate line and crossing over the second active pattern, a second source electrode connected to the second active pattern at one side of the second gate electrode, and a second drain electrode connected to the second active pattern at the other side of the second gate electrode. A third thin film transistor includes a third active pattern disposed within the unit pixel, a third gate electrode passing over the third active pattern, a third source electrode prolonged from the direct current signal line and connected to the third active pattern at one side of the third gate electrode, and a third drain electrode prolonged from the second drain electrode and connected to the third active pattern at the other side of the third gate electrode. A first capacitor includes a first electrode and a second electrode. The first electrode is prolonged from the second active pattern and disposed parallel to the direct current signal line below the direct current signal line. The second electrode is formed on the first electrode and connected to the first drain electrode. A second capacitor includes the second electrode and a third electrode formed on the second electrode. The third electrode is connected to the direct current signal line. The second capacitor has a different function from that of first capacitor. A pixel electrode connected to the third drain electrode is disposed within the unit pixel.

In a method of manufacturing an AMOLED according to the present invention, a first electrode and active patterns are formed on each of pixel regions on a substrate. A gate insulating layer is formed on the active patterns, the first electrode and the substrate. First, second and third gate electrodes are formed on a gate insulating layer above the active pattern and a second electrode is formed on the gate insulating layer above the first electrode to form a first capacitor including the first electrode, the gate insulating layer and the second electrode. An insulating interlayer is formed on the first, second and third gate electrodes, the second electrode and the gate insulating layer. First, second and third source electrodes, and first, second and third drain electrodes are formed on the insulating interlayer above the active pattern to form a first thin film transistor including the first gate electrode, the first source electrode and the first drain electrode, a second thin film transistor including the second gate electrode, the second source electrode and the second drain electrode, and a third thin film transistor including the third gate electrode, the third source electrode and the third drain electrode. At the same time, a third electrode is formed on the insulating interlayer above the first electrode to form a second capacitor vertically stacked on the first capacitor and including the second electrode, the insulating interlayer and the third electrode. A passivation layer is formed on the first, second and third thin film transistors, the first and second capacitors and the insulating interlayer. A pixel electrode is formed on the passivation layer. An organic EL element is formed on the pixel electrode.

According to the present invention, when compensation circuits needing two or more capacitors having different functions from each other per pixel are applied, the capacitors are stacked in a vertical direction to thereby prevent the aperture ratio from being lowered due to the increase in the number of the capacitors in the pixel.

BRIEF DESCRIPTION OF THE DRAWINGS

The above objects and other advantages of the present invention will become more apparent by describing in detail exemplary embodiments thereof with reference to the attached drawings in which.

BEST MODE FOR CARRYING OUT THE INVENTION

Now, exemplary embodiments of the present invention will be described in detail with reference to the annexed drawings.

Figure 2:
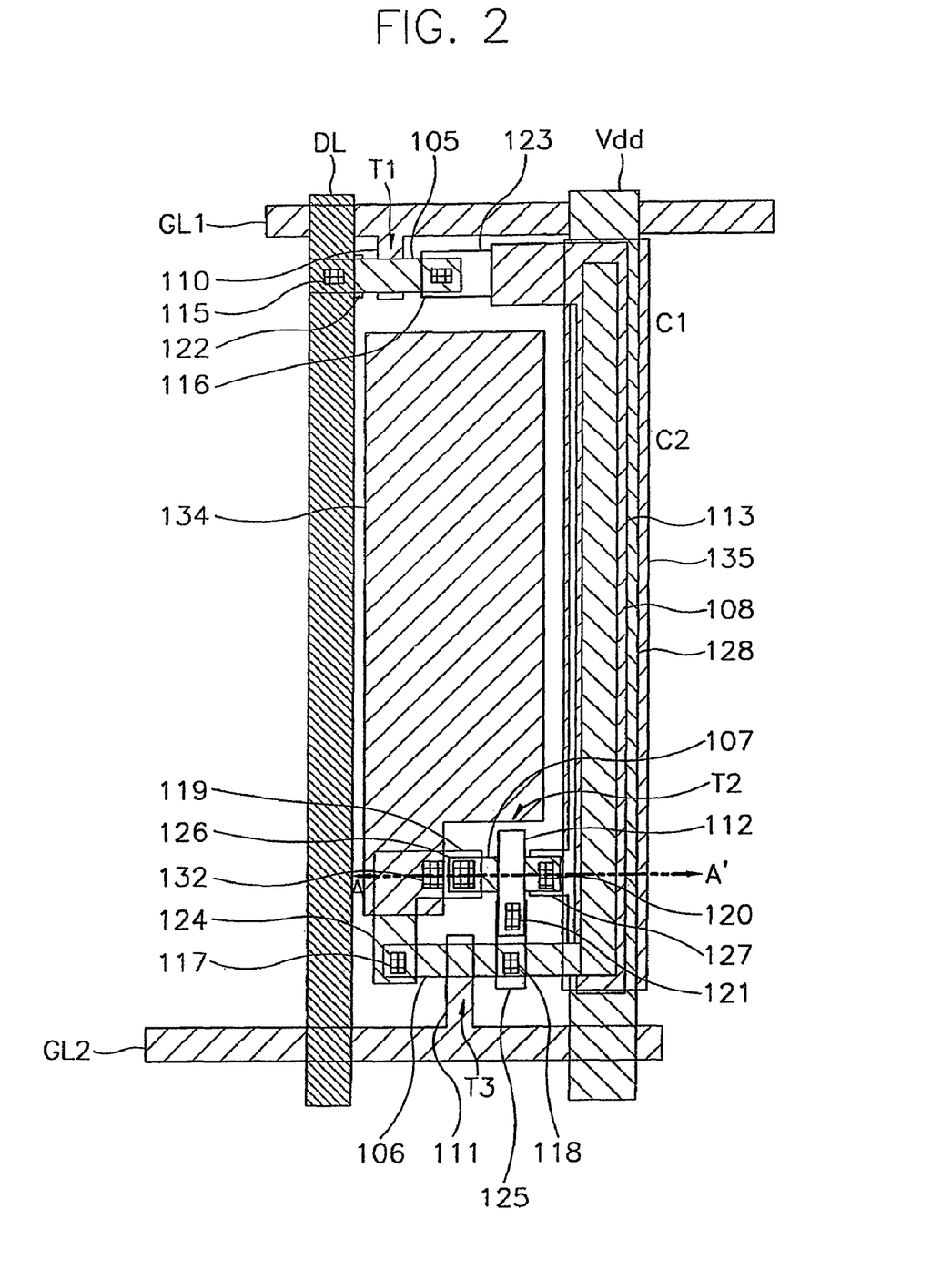
FIG. 2 is a plan view of an AMOLED device in accordance with one embodiment of the present invention.
Figure 3:
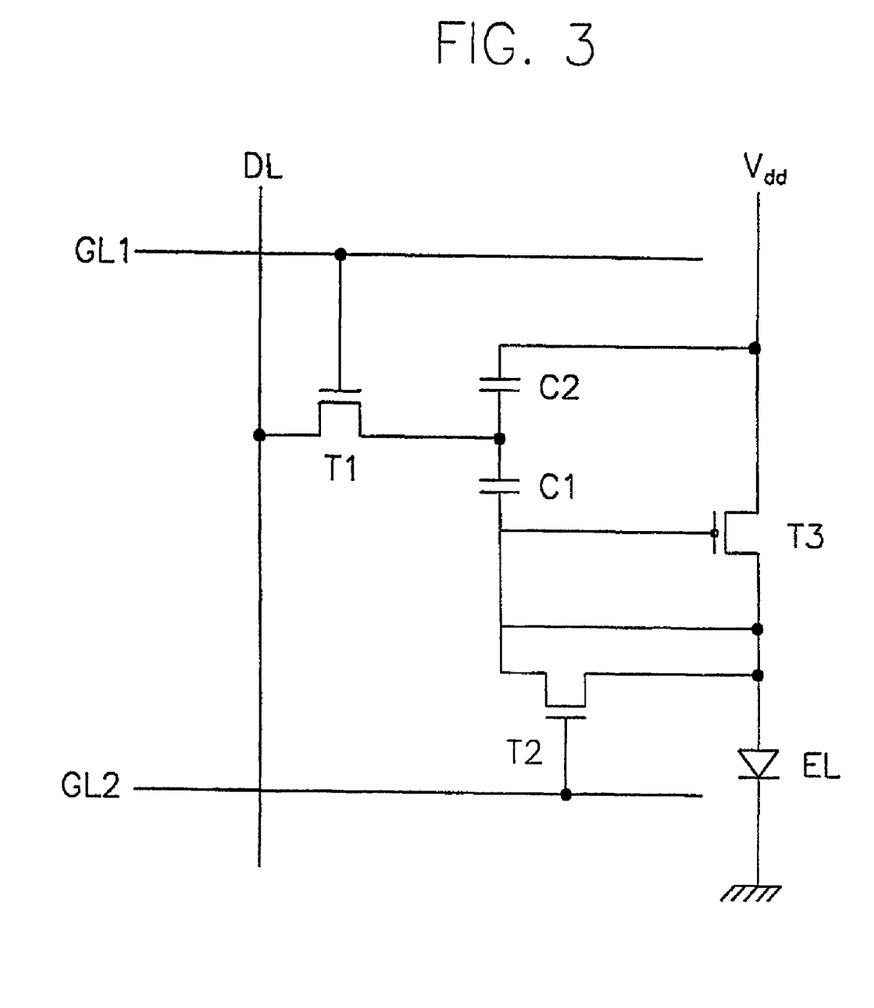
FIG. 3 is an equivalent circuit diagram of FIG. 2.
Figure 4:
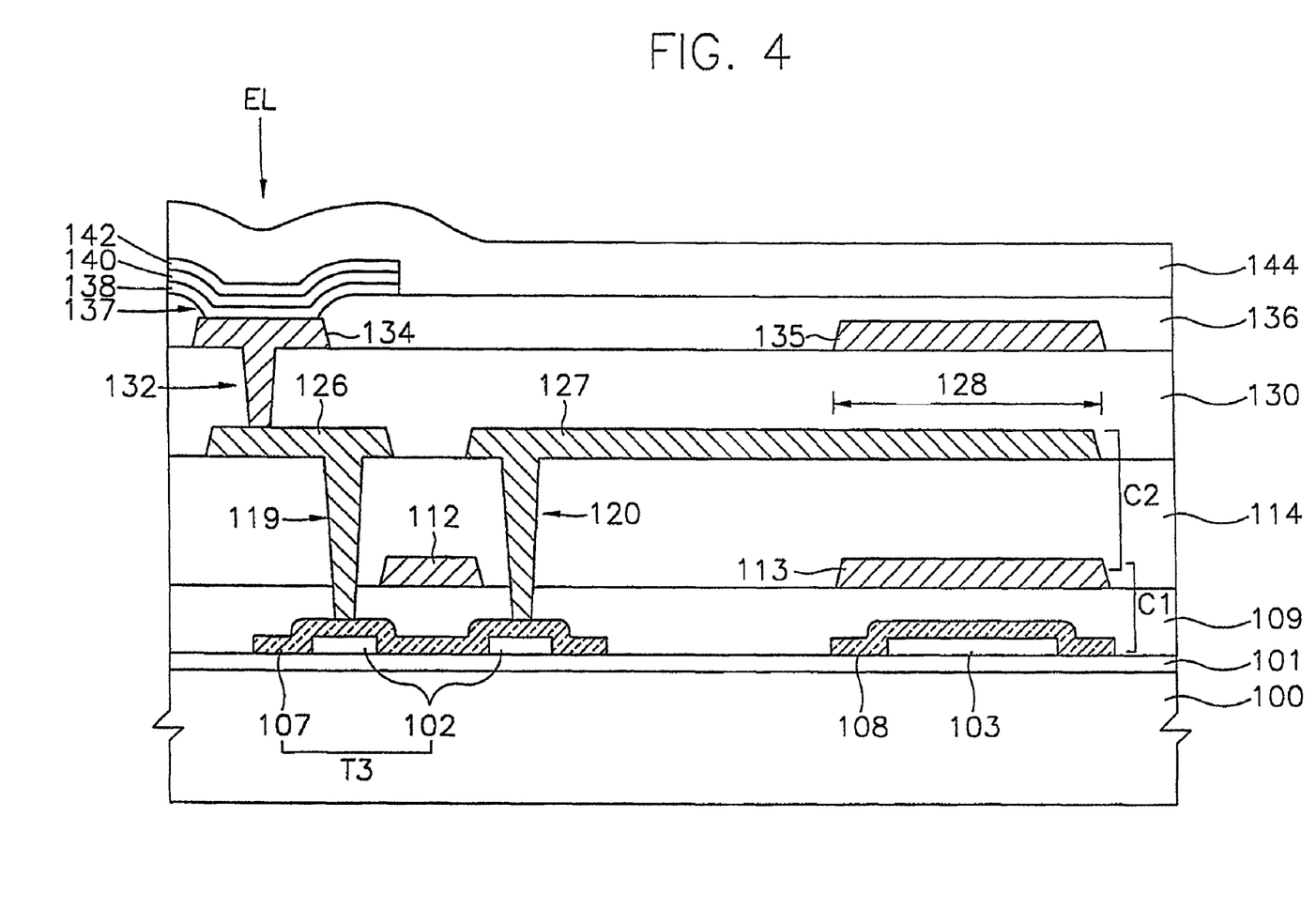
FIG. 4 is a cross-sectional view taken along the line A-A' of FIG. 2.

FIG. 2 is a plan view of an AMOLED device in accordance with one embodiment of the present invention, FIG. 3 is an equivalent circuit diagram of FIG. 2, and FIG. 4 is a cross-sectional view taken along the line A-A' of FIG. 2.

Referring to FIGS. 2 to 4, a unit pixel circuit of an AMOLED in accordance with the present invention includes three thin film transistors T1, T2 and T3, two capacitors C1 and C2, and four interconnection lines GL1, GL2, D1 and Vdd.

Particularly, a unit pixel is defined by first and second gate lines GL1 and GL2 extending in a first direction and a data line DL and a direct current signal line Vdd extending in a second direction perpendicular to the first direction.

The first gate line GL1 plays a role of turning on/off the first thin film transistor T1 as a switching element to thereby apply an initial data voltage and a gray level voltage through the data line DL. The second gate line GL2 plays a role of turning on/off the second thin film transistor T2 to thereby compensate the characteristics of the third thin film transistor T3 as a driving element. A maximum value of the display signal is constantly applied to the direct current signal line Vdd in a direct current state.

The first thin film transistor T1 includes a first active pattern 105 disposed adjacent to a cross point of the first gate line GL1 and the data line DL, a first gate electrode 110 prolonged from the first gate line GL1 and crossing over the first active pattern 105, a first source electrode 122 prolonged from the data line DL and connected to the first active pattern 105 at one side (a first side) of the first gate electrode 110, and a first drain electrode 123 connected to the first active pattern 105 at the other side (a second side that is opposite to the first side) of the first gate electrode 110. The first gate electrode 110 of the first thin film transistor T1 is connected to the first gate line GL1 and the first source electrode 122 thereof is connected to the data line DL.

The second thin film transistor T2 includes a second active pattern 106 disposed adjacent to a cross point of the second gate line GL2 and the data line DL, a second gate electrode 111 prolonged from the second gate line GL2 and crossing over the second active pattern 106, a second source electrode 125 connected to the second active pattern 106 at one side of the second gate electrode 111, and a second drain electrode 124 connected to the second active pattern 106 at the other side of the second gate electrode 111. The second gate electrode 111 of the second thin film transistor T2 is connected with the second gate line GL2.

The third thin film transistor T3 includes a third active pattern 107 disposed within the unit pixel, a third gate electrode 112 crossing over the third active pattern 107, a third source electrode 127 prolonged from the direct current signal line Vdd and connected to the third active pattern 107 at one side of the third gate electrode 112, and a third drain electrode 126 prolonged from the second drain electrode 124 and connected to the third active pattern 107 at the other side of the third gate electrode 112. The third gate electrode 112 of the third thin film transistor T3 is connected with the second source electrode 125 of the second thin film transistor T2, the third source electrode 127 thereof is connected with the direct current signal line Vdd, and the third drain electrode 126 thereof is connected with the second drain electrode 124 of the second thin film transistor T2 and an organic EL element.

Preferably, the third thin film transistor T3 is in a p-type, and the first and second thin film transistors T1 and T2 are in either n-type or p-type.

The first capacitor C1 includes a first electrode 108, a gate insulating layer 109 and a second electrode 113. The first electrode 108 is prolonged from the second active pattern 106 of the second thin film transistor T2 and disposed parallel to the direct current signal line Vdd below the direct current signal line Vdd. The second electrode 113 is overlapped with the first electrode 108. The first electrode 108 is formed from the same layer as in the active patterns 105, 106 and 107 of the first, second and third thin film transistors T1, T2 and T3. The second electrode 113 is formed from the same layer as in the gate line GL. The first electrode 108 of the first capacitor C1 is connected with the third gate electrode 112 of the third thin film transistor T3 and the second source electrode 125 of the second thin film transistor T3. The second electrode 113 of the first capacitor C1 is connected with the first drain electrode 123 of the first thin film transistor T1. The first capacitor C1 functions to store a voltage compensating for the characteristics of the third thin film transistor T3 and to transfer a data voltage to the third gate electrode 112 of the third thin film transistor T3.

The second capacitor C2 includes the second electrode 113, an insulating interlayer layer and a third electrode 128 overlapped with the second electrode 113. The third electrode 128 of the second capacitor C2 is connected to the direct current signal line Vdd.

The third electrode 128 is formed from the same layer as in the data line DL. The second capacitor C2 is connected between the direct current signal line Vdd and the first drain electrode 123 of the first thin film transistor T1. The second capacitor C2 functions to maintain the data voltage at a constant level during a frame time.

Accordingly, the first capacitor C1 and the second capacitor C2 have a different function from each other. While sharing a common electrode, i.e., the second electrode 113 connected to the first drain electrode 123 of the first thin film transistor T1, the first and second capacitors C1 and C2 are formed in a stacked structure in a vertical direction.

Within a unit pixel region of the present invention, there is formed a pixel electrode 134 connected to the third drain electrode 126 of the third thin film transistor T3. Also, a fourth electrode 135 formed from the same layer as in the pixel electrode 134 is formed to be overlapped with the third electrode 128 of the second capacitor C2. When it is requested that the second capacitor C2 has a high capacitance, the insulating interlayer 114 and the passivation layer 130 disposed between the second electrode 113 and the fourth electrode 135 serve as a dielectric layer of the capacitor, thereby securing a necessary capacitance.

The pixel circuit of the present invention operates as follows.

If the first thin film transistor T1 is turned on by the first gate line GL1, the third thin film transistor T3 is turned on according to a display signal value of the data line DL, so that a direct current signal value of the direct current signal line Vdd is applied to the organic EL element to thereby drive the organic EL element. At this time, if a compensation voltage is applied to the second gate line GL2 to turn on the second thin film transistor T2, the third gate electrode 112 and the third drain electrode 126 of the third thin film transistor T3 are connected to each other, so that a difference in the characteristics of the third thin film transistor T3 as a driving element is reduced.

Hereinafter, there is described a method of manufacturing the AMOLED having the aforementioned structure in accordance with the present invention.

FIGS. 5A to 5E are cross-sectional views for illustrating the AMOLED shown in FIG. 4.

Figure 5A:
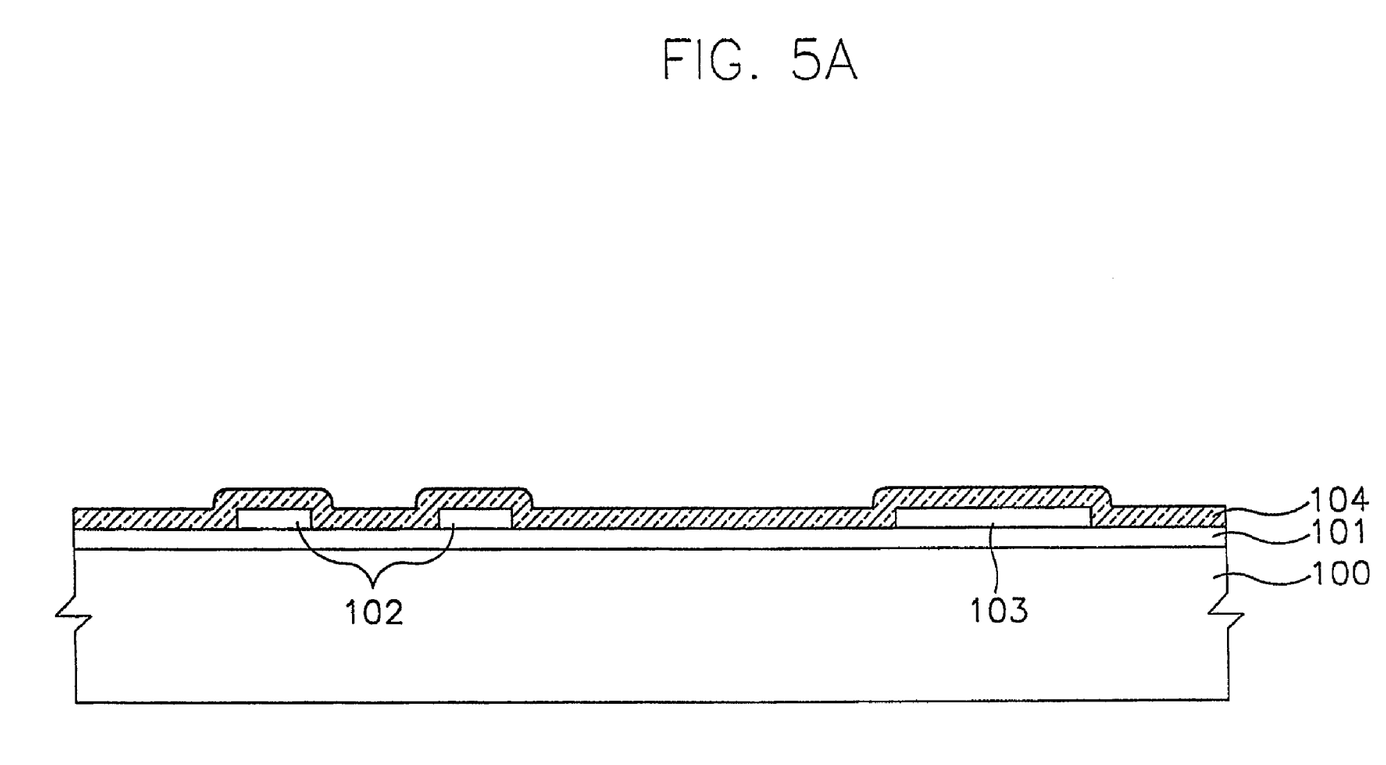
FIGS. 5A to 5E are cross-sectional views for illustrating a method of manufacturing the AMOLED device shown in FIG. 4.

Referring to FIG. 5A, on an insulating substrate 100 such as glass, quartz or sapphire, silicon oxide is deposited to a thickness of an approximately 2,000 Å by a plasma-enhanced chemical vapor deposition (PECVD), to form a blocking layer 101. The blocking layer 101 is preferably used to prevent heat loss during a subsequent crystallization process of an amorphous silicon film.

An n-type doped amorphous silicon is deposited to a thickness of about 800 Å by the PECVD on the blocking layer 101, and then, patterned using a photolithography process to form buffer layers 102 and 103 on a thin film transistor region and a capacitor region within the unit pixel.

Thereafter, on the buffer layers 102 and 103 and the blocking layer 101, an amorphous silicon is deposited to a thickness of about 500 Å by a low pressure chemical vapor deposition (LPCVD) or a PECVD method to thereby form an active layer 104. Then, a laser annealing or a furnace annealing is carried out to crystallize the active layer 104 into a polycrystalline silicon layer.

Figure 5B:
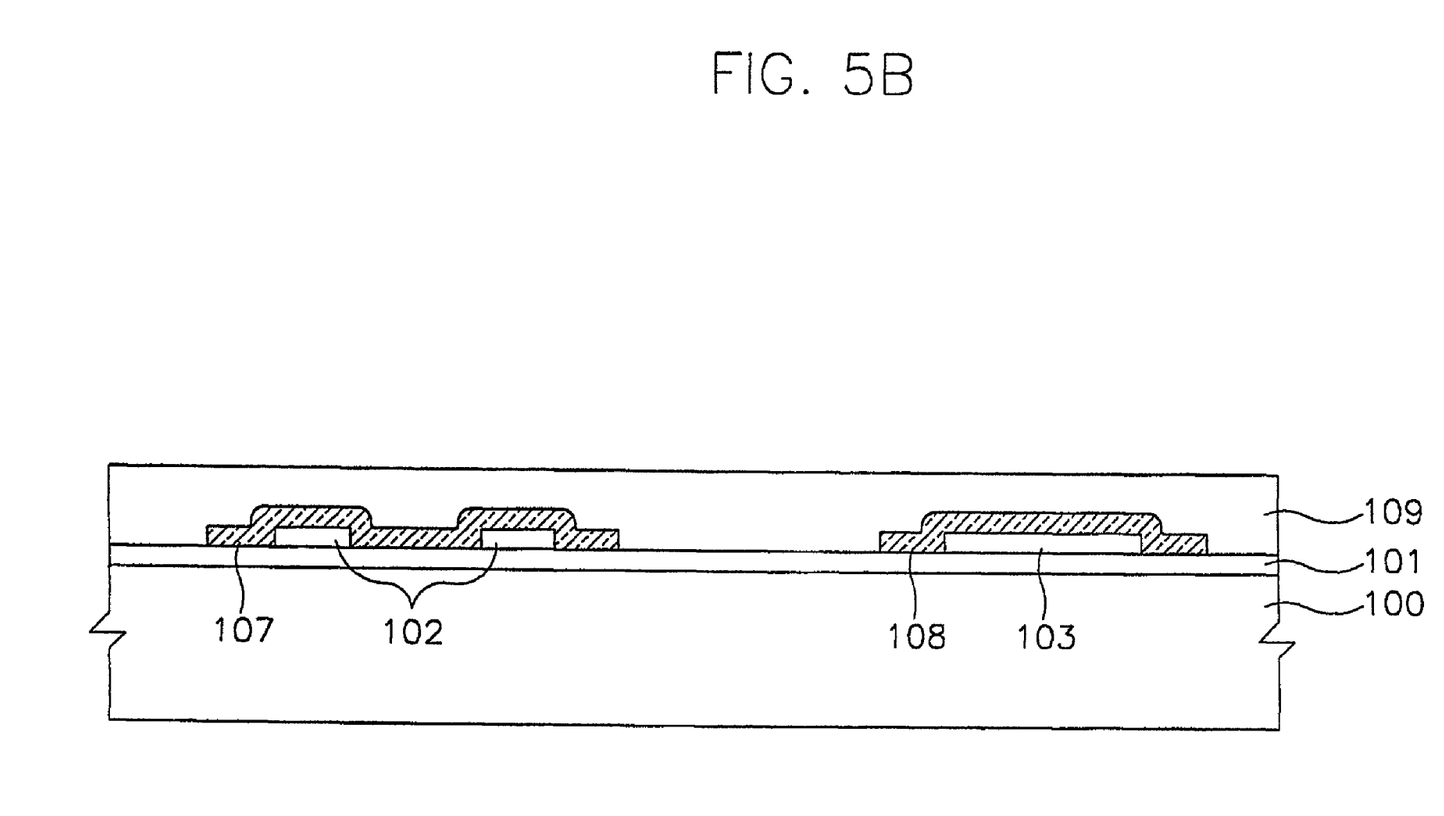

Referring to FIG. 5B, through a photolithography process, the polycrystalline silicon active layer 104 is patterned to form a first active pattern (105 in FIG. 2), a second active pattern (106 in FIG. 2) and a third active pattern 107 on the thin film transistor region within the unit pixel. At the same time, a first electrode 108 made of the polycrystalline silicon active layer is formed on the capacitor region within the unit pixel.

Then, on the entire surface of the resultant structure on which the active patterns 105, 106 and 107 and the first electrode 108 are formed, silicon oxide is deposited to a thickness of about 1000-2000 Å by the PECVD method, thereby forming a gate insulating layer 109.

Figure 5C:
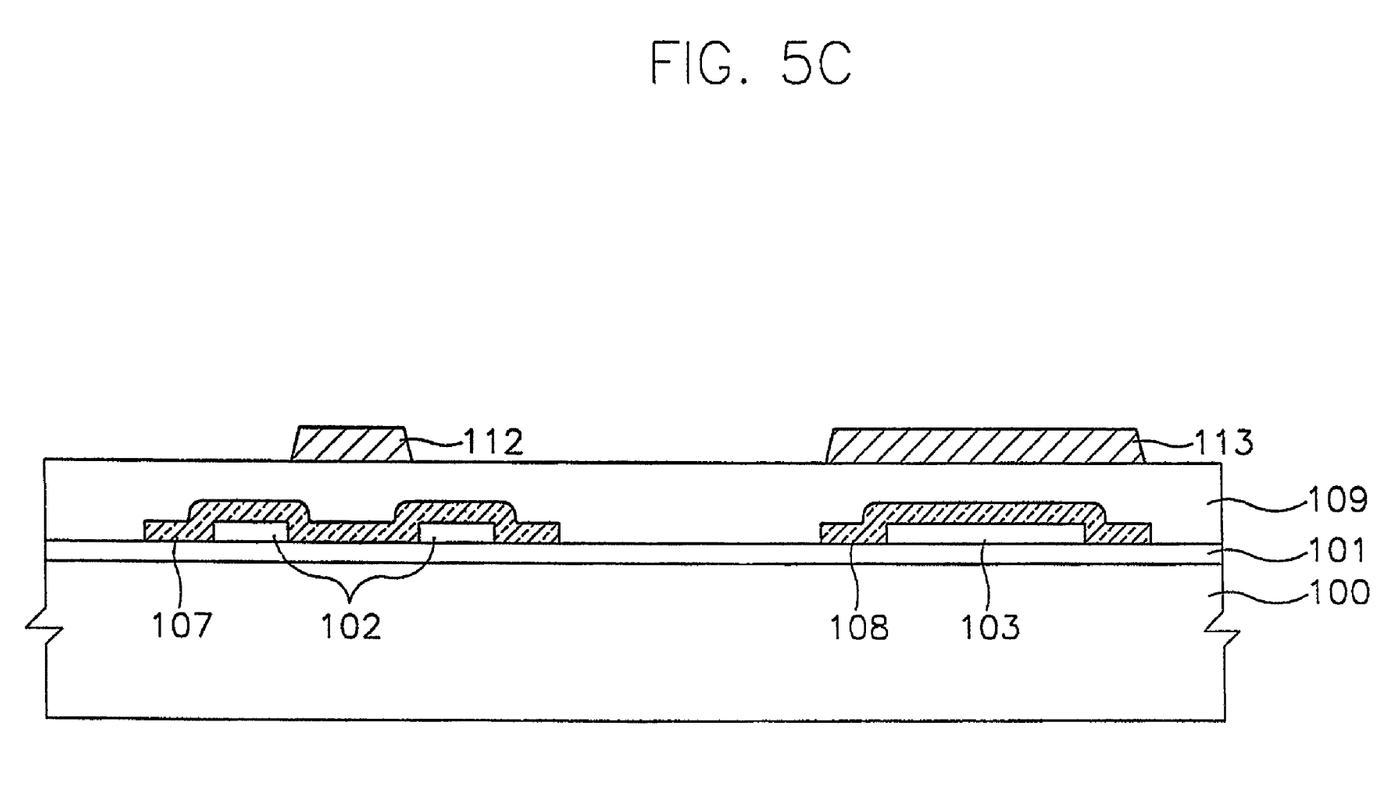

Referring to FIG. 5C, on the gate insulating layer 109, a gate layer such as AlNd is deposited to a thickness of approximately 3000 Å by a sputtering method. Then, the gate layer is patterned via a photolithography process. As a consequence, there are formed first and second gate lines (GL1 and GL2 in FIG. 2) extending in a first direction, a first gate electrode (110 in FIG. 2) of the first thin film transistor T1 branched from the first gate line GL1, a second gate electrode (111 in FIG. 2) of the second thin film transistor T2 branched from the second gate line GL2, a third gate electrode 112 of the third thin film transistor T3 arranged within the unit pixel. At the same time, the second electrode 113 made from the gate layer is formed to be overlapped with the first electrode 108. The second electrode 113 is used as a common electrode of the stack type first and second capacitors C1 and C2.

Then, by performing an impurity ion implantation using a photo mask used in the patterning process of the gate layer, source/drain regions (not shown) of the first, second and third thin film transistors T1, T2 and T3 are formed. Preferably, the third thin film transistor T3 is in p-type, and the first and second thin film transistors T1 and T2 are in n-type or p-type.

Figure 5D:
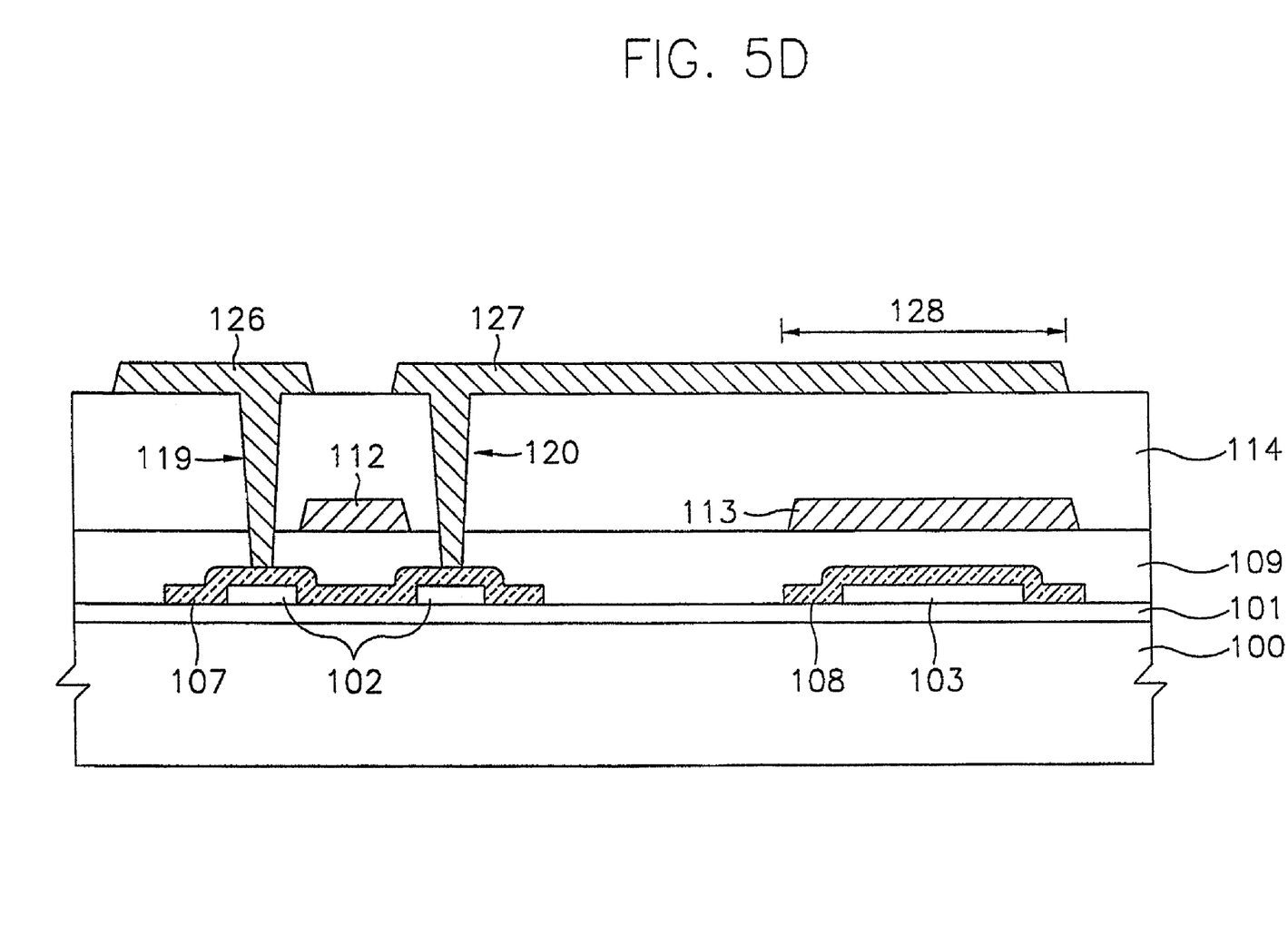

Referring to FIG. 5D, in order to activate the doped ions in the source and drain regions and cure damages of the silicon layer, a laser annealing or a furnace annealing is performed. Then, silicon nitride is deposited on the entire surface of the resultant structure to a thickness of approximately 8,000 Å to thereby form an insulating interlayer 114.

Thereafter, the insulating interlayer 114 is etched by a photolithography process to form contact holes 115, 116, 117, 118, 119 and 120 exposing the source/drain regions of the first, second and third thin film transistors T1, T2 and T3. At this time, a contact hole 121 exposing a predetermined portion of the third gate electrode 112 of the third thin film transistor T3 is also formed.

A data layer such as MoW or AlNd layer is deposited on the contact holes 115, 116, 117, 118, 119, 120 and 121 and the insulating interlayer 114 to a thickness of about 3000-6000 Å, and then, patterned by a photolithography process. As a consequence, there are formed a data line DL and a direct current signal line Vdd which are extended in a second direction perpendicular to the first direction, first source/drain electrodes (122 and 123 of FIG. 2) of the first thin film transistor T1, second source/drain electrodes (125 and 124 of FIG. 2) of the second thin film transistor T2, and third source/drain electrodes 127 and 126 of the third thin film transistor T3, which are connected to the source/drain regions through the contact holes. At the same time, the third electrode 128 made from the data layer is formed to be overlapped with the second electrode 113. The third electrode 128 is comprised of the direct current signal line Vdd, and connected to the third source electrode 127 of the third thin film transistor T3. Preferably, using a single electrode pattern, the second drain electrode 124 of the second thin film transistor T2 and the third drain electrode 126 of the third thin film transistor T3 are formed at the same time. Also, the second source electrode 125 of the second thin film transistor T2 is formed to make contact with the third gate electrode 112 of the third thin film transistor T3.

Figure 5E:
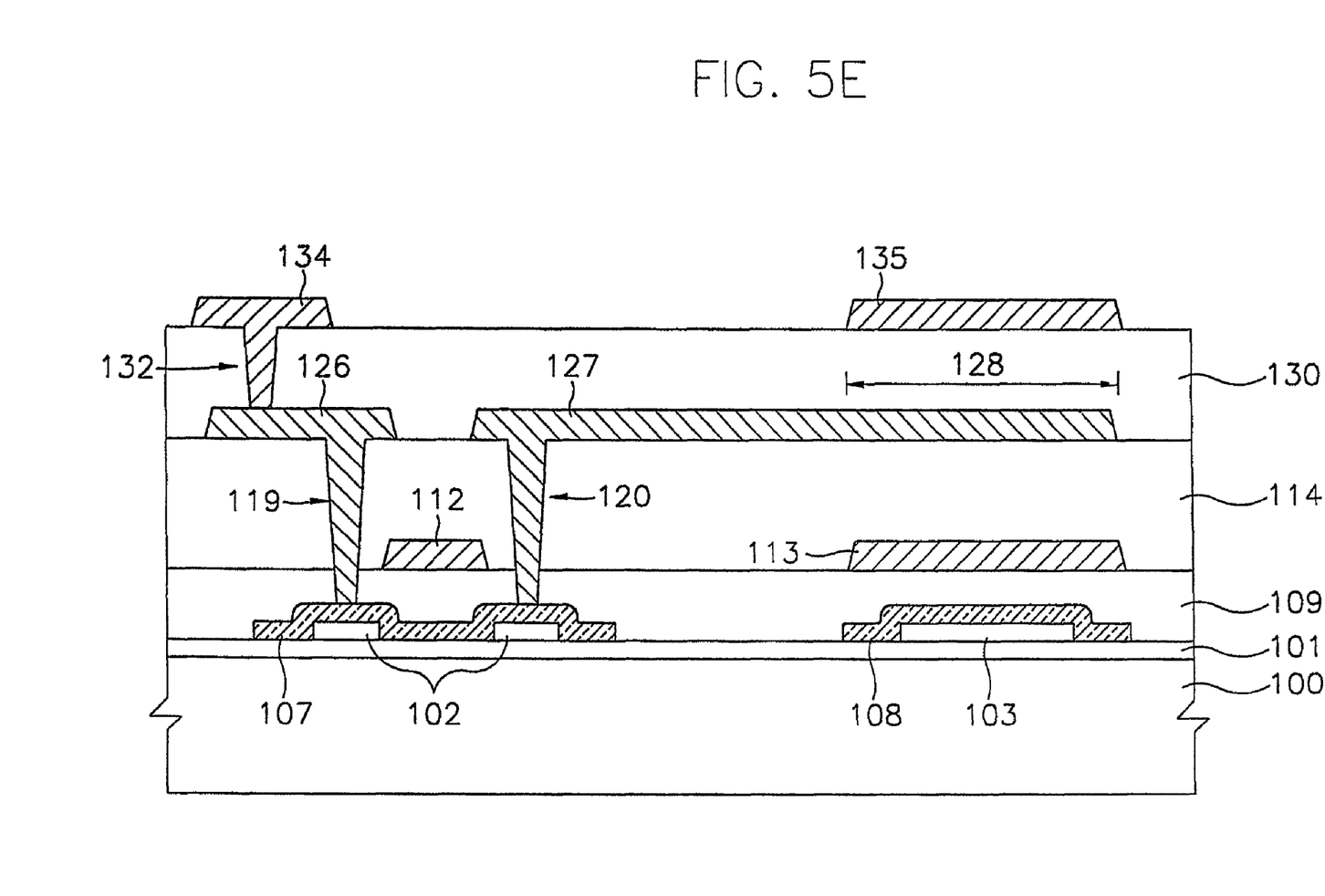

Referring to FIG. 5E, silicon nitride is deposited on the data line DL, the direct current signal line Vdd, the source/drain electrodes 122, 123, 124, 125, 126 and 127 and the insulating interlayer 130 to a thickness of approximately 2000-3000 Å to form a passivation layer 130. Thereafter, the passivation layer 130 is etched away using a photolithography process to form a via hole 132 exposing the third drain electrode 126 of the third thin film transistor T3.

A transparent conductive layer such as indium tin oxide (ITO) or indium zinc oxide (IZO) is deposited to a thickness of approximately 300-500 Å on the via hole 132 and the passivation layer 130, and then, patterned by a photolithography process. By doing so, a pixel electrode 134 is formed to be connected with the third drain electrode 126 of the third thin film transistor T3 through the via hole 132. At the same time, a fourth electrode 135 made of the transparent conductive layer is formed to be overlapped with the third electrode 128.

As shown in FIG. 4, after forming an organic insulating layer 136 on the pixel electrode 134, the fourth electrode 135 and the passivation layer 130, the organic insulating layer 136 is exposed and developed to thereby form an opening 137 having the same shape as the pixel electrode 134. Preferably, the opening 137 is formed to have a width smaller than that of the pixel electrode 134.

Then, a hole transfer layer (HTL) 138, a luminescent layer 140 and an electron transfer layer (ETL) 142 are sequentially formed on the opening 137 and the organic insulating layer 136. A cathode electrode 144 is formed thereon to thereby complete an organic EL element.

As described above, according to the present invention, when a compensation circuit needing two or more capacitors having different functions from each other per pixel is applied, the two or more capacitors are vertically stacked, thereby preventing the aperture ratio from being lowered due to the increase in the number of capacitors within the pixel.

Also, it is apparent that a stack type capacitor of the invention can be applied to any other pixel circuits using two or more capacitors having different functions from each other.

While the present invention has been described in detail, it should be understood that various changes, substitutions and alterations can be made hereto without departing from the spirit and scope of the invention as defined by the appended claims.

What is claimed is:

1. An active matrix type organic electroluminescent display device comprising:
    a data line extended in a first direction;
    a direct current signal line;
    a first gate line extended in a second direction different from the first direction;
    a first thin film transistor including a first gate electrode connected to the first gate line, a first source electrode connected to the data line and a first drain electrode;
    a first capacitor including a first electrode and a second electrode;
    a second capacitor including the second electrode and a third electrode;
    a second thin film transistor including a second gate electrode connected to the first capacitor, a second source electrode connected to the direct current signal line and a second drain electrode; and
    an organic electroluminescent element connected to the second drain electrode of the second thin film transistor,
    wherein the first and second capacitors are disposed in a vertically stacked structure within a unit pixel region and the first drain electrode of the first thin film transistor is connected between the first capacitor and the second capacitor.

2. The active matrix type organic electroluminescent display device of claim 1, wherein the second source electrode of the second thin film transistor is connected to the third electrode of the second capacitor.

3. The active matrix type organic electroluminescent display device of claim 1, further comprising:
    a second gate lines extending in the second direction; and
    a third thin film transistor having a third gate electrode connected to the second gate line, a third source electrode connected to the second gate electrode of the second thin film transistor and a third drain electrode connected to the second drain electrode of the second thin film transistor.

4. The active matrix type organic electroluminescent display device of claim 3, wherein the organic electroluminescent element is connected between the second drain electrode of the second thin film transistor and a ground terminal.

5. The active matrix type organic electroluminescent display device of claim 3, wherein the first electrode of the first capacitor is connected to the second gate electrode of the second thin film transistor and the third source electrode of the third thin film transistor, and the second electrode of the first capacitor is connected to the first drain electrode of the first thin film transistor.

6. The active matrix type organic electroluminescent display device of claim 3, wherein
    the first thin film transistor comprises a first active pattern disposed adjacent to a cross point of the first gate line and the data line, the first gate electrode prolonged from the first gate line and crossing over the first active pattern, the first source electrode prolonged from the data line and connected to the first active pattern at a first side of the first gate electrode, and the first drain electrode connected to the first active pattern at a second side of the first gate electrode,
    the second thin film transistor comprises a second active pattern disposed within the unit pixel, the second gate electrode crossing over the second active pattern, the second source electrode prolonged from the direct current signal line and connected to the second active pattern at a first side of the second gate electrode, and the second drain electrode prolonged from the third drain electrode and connected to the second active pattern at a second side of the second gate electrode, and
    the third thin film transistor comprises a third active pattern disposed adjacent to a cross point of the second gate line and the data line, the third gate electrode prolonged from the second gate line and crossing over the third active pattern, the third source electrode connected to the third active pattern at a first side of the third gate electrode, and the third drain electrode connected to the third active pattern at a second side of the third gate electrode.

7. The active matrix type organic electroluminescent display device of claim 6, wherein the first electrode is prolonged from the third active pattern and disposed parallel to the direct current signal line below the direct current signal line, the second electrode is formed on the first electrode and connected to the first drain electrode, and the third electrode is formed on the second electrode, and connected to the direct current signal line.

8. The active matrix type organic electroluminescent display device of claim 7, further comprising a pixel electrode disposed within the unit pixel so as to be connected to the second drain electrode.

9. The active matrix type organic electroluminescent display device of claim 7, wherein the first electrode, and the first, second and third active patterns are formed from a same layer.

10. The active matrix type organic electroluminescent display device of claim 7, wherein the second electrode and the gate line are formed from a same layer.

11. The active matrix type organic electroluminescent display device of claim 7, wherein the third electrode and the data line are formed from a same layer.

12. The active matrix type organic electroluminescent display device of claim 8, further comprising a fourth electrode formed from a same layer as in the pixel electrode on the direct current signal line.

* * * * *